United States Patent
Sasano

[11] Patent Number: 5,579,984
[45] Date of Patent: Dec. 3, 1996

[54] BONDING COORDINATE TEACHING METHOD AND TEACHING MEANS

[75] Inventor: Toshiaki Sasano, Sagamihara, Japan

[73] Assignee: Kabushiki Kaisha Shinkawa, Tokyo, Japan

[21] Appl. No.: 429,707

[22] Filed: Apr. 27, 1995

[30] Foreign Application Priority Data

Apr. 27, 1994 [JP] Japan .................................. 6-110240

[51] Int. Cl.$^6$ .................................. H01L 21/60
[52] U.S. Cl. .................. 228/102; 228/4.5; 228/9; 228/105; 348/95
[58] Field of Search .................... 228/4.5, 7, 9, 102, 228/180.5, 105; 348/87, 95

[56] References Cited

U.S. PATENT DOCUMENTS 4,972,311 11/1990 Holdgrafer et al. ............... 348/95 X
4,984,731 1/1991 Imamura ........................... 228/102
5,119,436 6/1992 Holdgrafer ....................... 228/105 X
5,121,870 6/1992 Evans, Jr. et al. ................. 228/102
5,123,585 6/1992 Terakado et al. .................. 228/102
5,350,106 9/1994 Fogal ............................. 228/105 X

*Primary Examiner*—Kenneth J. Ramsey
*Attorney, Agent, or Firm*—Koda and Androlia

[57] ABSTRACT

In wire bonding used in manufacturing, for example, semiconductor devices, inputting of the coordinates of the first and second leads of a lead frame, on which a semiconductor chip is installed, into an operation controller makes it possible that the coordinates of all of the remaining leads are automatically calculated by an image processor and the bonding coordinates for such leads are also automatically calculated.

4 Claims, 6 Drawing Sheets

5,579,984

BONDING COORDINATE TEACHING METHOD AND TEACHING MEANS

BACKGROUND OF THE INVENTION

1. Field of the Invention

The present invention relates to a teaching method and teaching means for bonding coordinates, particularly to bonding coordinates of leads of lead frames connected to semiconductor chips.

2. Prior Art

As seen from FIG. 6, a workpiece 3 is obtained by connecting the pads $P_1, P_2 \ldots$ ) of a semiconductor chip 2 and the leads $L_1, L_2 \ldots$ ) of a lead frame 1 via wires 4, and such connections are performed by a wire bonding apparatus shown as an example in FIG. 7.

In the wire bonding method that is exercised by the bonding apparatus shown in FIG. 7, any positional discrepancy is first detected at at least two fixed points on the semiconductor chip 2 and at least two fixed points on the lead frame 1 by a camera 11, and bonding coordinates stored beforehand are corrected via the operating part of the bonding apparatus on the basis of these detected values.

When the detection by the camera 11 is performed, an X-axis motor 12 and a Y-axis motor 13 are actuated so that the central (optical) axis 11a of the camera 11 is positioned directly above each measurement point. After the bonding coordinates have been corrected, a capillary 15 is moved in X and Y directions, or horizontally, and in the Z direction, or vertically, so that a wire 4 passing through the capillary 15 is bonded to the workpiece.

In this bonding method, the central axis 11a of the camera 11 and the central axis 15a of the capillary 15 are offset by a distance W. Accordingly, an XY table 16 is moved a distance equal to the an offset value W by the X- and Y-axis motors 12 and 13, so that the capillary 15 is positioned above the first bonding point. Afterward, the wire 4 is bonded at the corrected bonding coordinates by moving the XY table in XY directions by the X- and Y-axis motors 12 and 13 and also by moving the capillary 15 in the Z direction by raising and lowering a capillary arm 17 (or pivoting the capillary arm 17) by a Z-axis motor 14.

In FIG. 7, Xw indicates the X-axis component of the offset value W, and Yw indicates the Y-axis component of the offset value W.

In the wire bonding method as described above, it is necessary to input respective bonding coordinates into the memory of the bonding apparatus before the wire bonding operation. Such input of bonding coordinates is also necessary when the type of workpiece to be wire-bonded is changed. These respective bonding coordinates to be inputted include the bonding coordinates of pads $P_1, P_2 \ldots$ and the bonding coordinates of corresponding leads $L_1, L_2 \ldots$, and the inputting of these respective bonding coordinates into the bonding apparatus is generally accomplished by means of a teaching method.

Conventionally, the teaching of the respective bonding coordinates of the leads $L_1, L_2 \ldots$ is accomplished in the following manner:

a. First, a manual input device such as a ten-key, chessman, etc., which drives the X-axis motor 12 and Y-axis motor 13 is manually operated so that the coordinates $L_1$ ($x_1$, $y_2$) of the first lead $L_1$ are inputted. These coordinates are shown on a television monitor.

b. Next, the operator, while watching the monitor, operates the manual input device so that the position that appears to be the bonding coordinates of the first lead $L_1$ is aligned with cross-hairs drawn at the center of the television monitor. This coordinate position is stored in the memory of the bonding apparatus.

The operation described above is performed for all of the leads $L_1, L_2 \ldots$. The teaching of the bonding coordinates for the pads $P_1, P_2 \ldots$ of a semiconductor chip is accomplished in a similar manner.

In the prior art described above, the operator teaches bonding coordinates by operating the manual input device in a specified order. Thus, the positional alignment operation must be repeated a number of times equal to the number of sets of bonding coordinates involved. As a result, it takes considerable time. In addition, chances are that alignment errors occur as a result of mistakes made by the operator and differences between individual operators. Furthermore, in such a manual input, the clearness of the object images on the monitor is determined by the resolution of the monitor. As a result, finer positions than the monitor is capable of showing cannot be seen nor judged, and the positional precision is determined on the basis of pixel (picture element) units.

SUMMARY OF THE INVENTION

Accordingly, the object of the present invention is to provide a bonding coordinate teaching method and teaching means which can shorten the operating time required and improve the precision of positional alignment.

The method of the present invention to accomplish the object is performed in a wire bonding apparatus that includes a capillary for connecting pads and leads via wires for a workpiece that consists of a semiconductor chip installed on a lead frame, a camera for obtaining an image of the workpiece, and an XY table for moving the capillary and camera together horizontally, and the feature of the method according to the present invention is that:

(1) The teaching for the first and second leads is accomplished by:

(i) inputting tentative bonding coordinates using a manual input device, (ii) moving the camera so that the camera can take the image of the leads of lead frame, (iii) calculating the respective distances from the tip of the lead and the center of the lead width of each of the first and second leads by the image controller of an image processor, (iv) correcting the manually input tentative bonding coordinates of the first and second leads by means of the operation controller of an operation driver, and (v) storing the corrected coordinates as new bonding coordinates in a bonding coordinate memory, and (2) The teaching for the third and the following leads is accomplished respectively by:

(i) calculating the difference between two sets of new bonding coordinates of the leads that are immediately preceding the currently detected lead and the lead preceding to such an immediately preceding lead by the operation controller of the operation driver, (ii) either (a) moving the camera by an amount that corresponds to such difference from the bonding coordinates of the lead immediately preceding the currently detected lead or (b) adding such difference to the bonding coordinates of the lead immediately preceding the currently detected lead so that tentative bonding coordinates are produced, (iii) calculating by the image controller of the image processor the distance from the tip end of the lead and the center of the width of the lead imaged by the camera, (iv) correcting the coordinates to which the camera has been moved or the tentative bonding coordinates by the operation controller of the operation driver, and (v) storing the corrected coordinates as new bonding coordinates in the bonding coordinate memory.

In order to accomplish the object, the apparatus of the present includes a capillary for connecting pads and leads via wires for a workpiece that consists of a semiconductor chip installed on a lead frame, a camera for obtaining an image of the workpiece, an XY table for moving the capillary and camera together horizontally, and a manual input device for inputting bonding coordinates, and the feature of the apparatus of the present invention is that the apparatus further includes:

(A) an image controller installed in an image processor, the image controller processing the images obtained by the camera and calculates distances from the tip of a lead and center of width of the imaged lead obtained by the camera, (B) an operation controller installed in an operation driver for the apparatus, the operation controller being designed so that (1) For the first and second leads, (i) tentative bonding coordinates are inputted using a manual input device, (ii) the camera is moved so that the leads are imaged, (iii) the distances from the tip of the lead and the center of the width of the lead imaged by the camera are calculated by the image controller of the image processor, and (iv) the tentative bonding coordinates of the first and second leads are corrected so that new bonding coordinates are produced, and (2) For all leads from the third lead on, (i) the difference between the respective new bonding coordinates of the lead immediately preceding the currently detected lead and the lead preceding such immediately preceding lead is calculated, (ii) either (a) the camera is moved by an amount that corresponds to the difference from the bonding coordinates of the lead immediately preceding the currently detected lead, or (b) the difference is added to the bonding coordinates of the lead immediately preceding the currently detected lead so that tentative bonding coordinates are produced, (iii) the distance from the tip of the lead and the center of the width of the lead imaged by the camera is calculated by the image controller of the image processor, and (iv) the coordinates to which the camera has been moved or the tentative bonding coordinates are corrected so that new bonding coordinates are produced, and (C) a bonding coordinate memory which stores the new bonding coordinates.

For the first and second leads, a manual input device is used to move the camera to positions directly above the leads, and the coordinates of such (first and second) leads are inputted via the manual input device. As a result, the distances from the tip of the lead and any shift from the center width of each of the first and second leads are calculated by the image controller of the image processor. The operation controller of the operation driver then corrects the manually input coordinates according to the shift amounts obtained by the image controller, and the corrected coordinates are stored in the bonding coordinate memory as respective new bonding coordinates for the first and second leads.

For the leads from the third lead on, there is no need for manual input; instead, automatic processing is performed by the operation controller of the operation driver using the two sets of new bonding coordinates obtained for the lead immediately preceding the currently detected (or target) lead, and the lead preceding the currently detected lead by two leads.

More specifically, the camera is moved by an amount equal to the difference between the two sets of new bonding coordinates, and the distance from the tip end of the lead and the amount of shift from the center of the width of the lead are calculated by the image controller of the image processor, the coordinates to which the camera has been moved are corrected according to the shift amounts, and then the corrected coordinates are stored in the bonding coordinate memory as new bonding coordinates.

DETAILED DESCRIPTION OF THE INVENTION

One embodiment of the present invention will be described below with reference to FIGS. 1 through 7.

Figure 1:
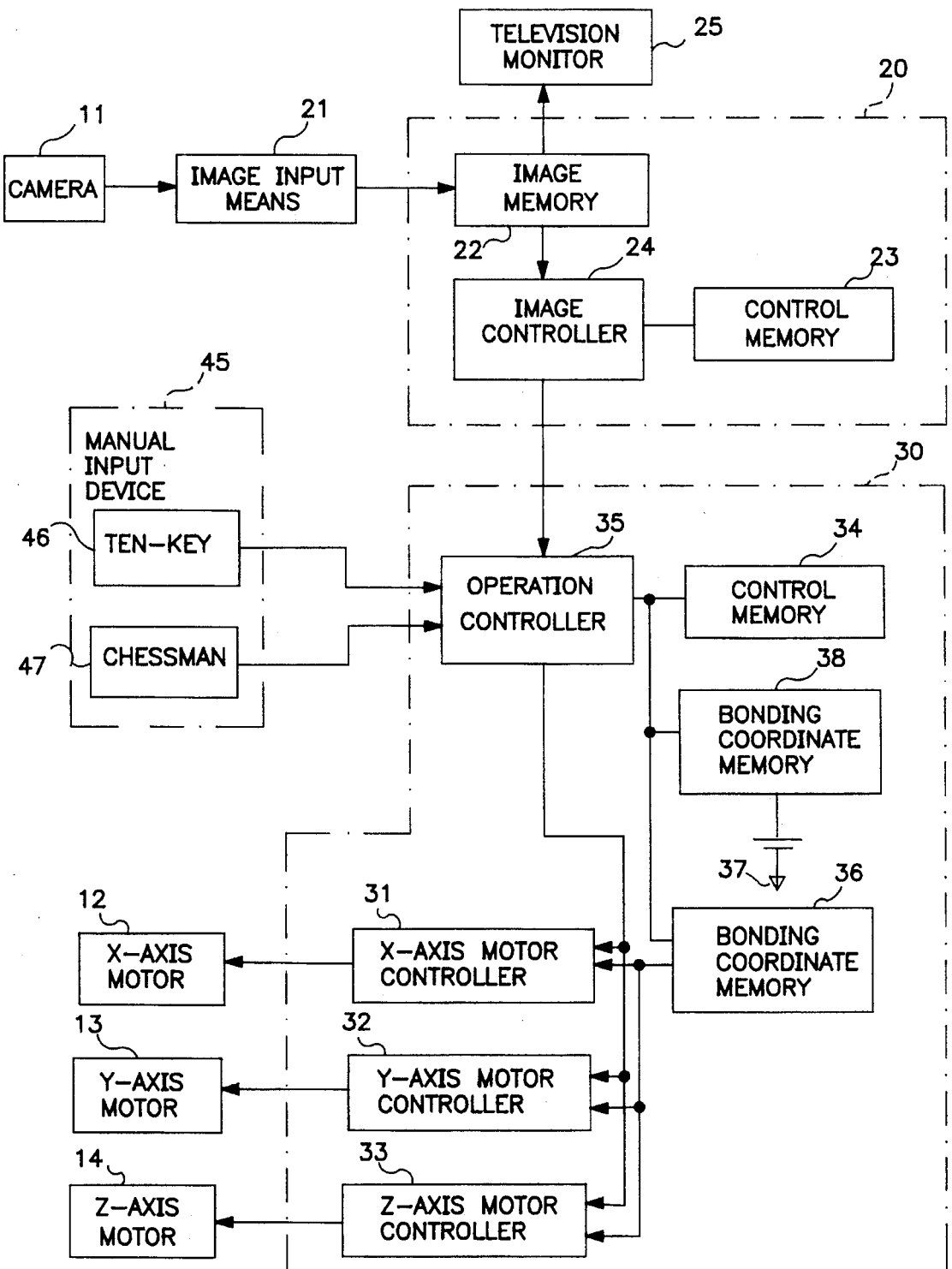
FIG. 1 is a block diagram illustrating one embodiment of the control circuit used in the teaching method of the present invention.
Figure 7:
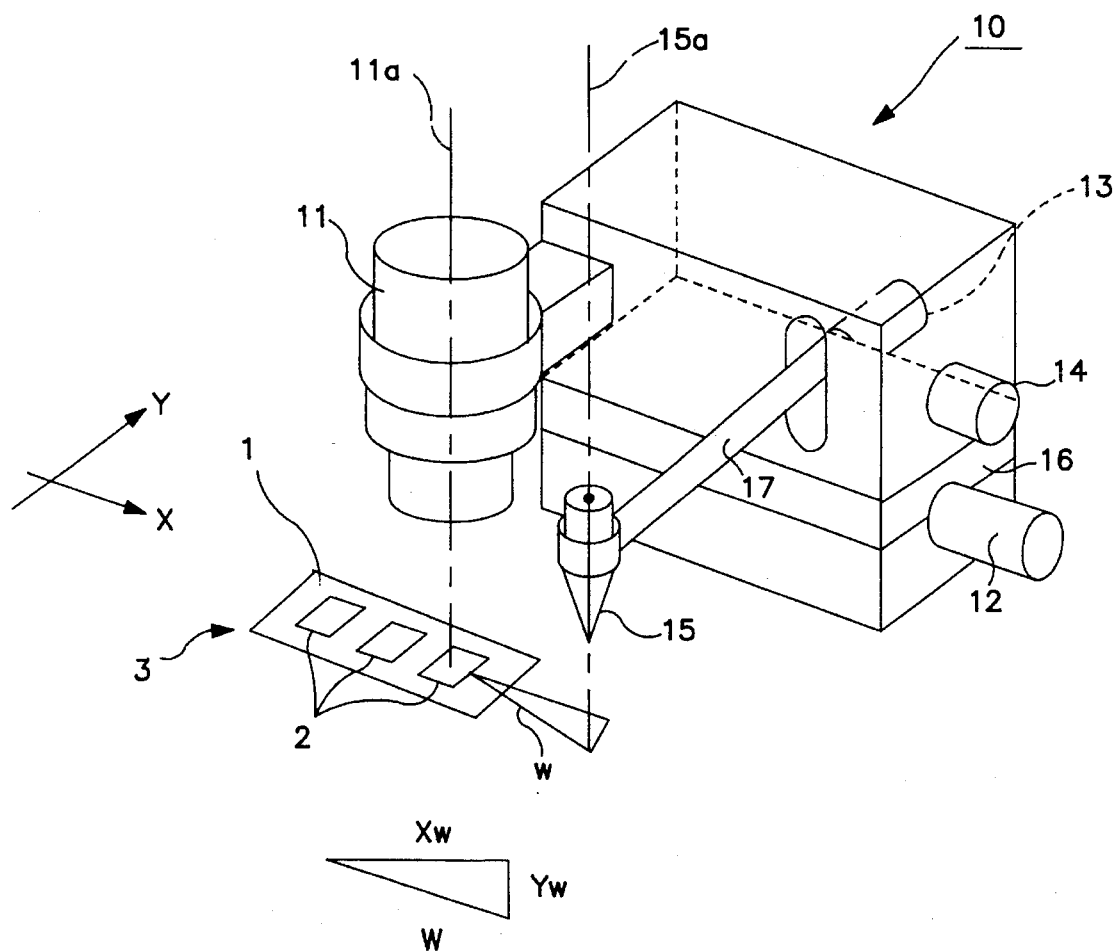
FIG. 7 is a perspective view illustrating one example of a wire bonding apparatus.

As shown in FIG. 1, the control circuit part of the bonding apparatus comprises an image processor 20 which processes images obtained by a camera 11, an operation driver 30 which drives the wire bonding apparatus 10 shown in FIG. 7, and a manual input device 45 which allows the manual input of data such as coordinates, etc. into the operation driver 30.

The image processor 20 includes an image memory 22 which stores video image forms inputted from the camera 11 via an image input means 21, a control memory 23 in which image processing procedures for the image memory 22 are stored, and an image controller (CPU) 24 which processes images sent from the image memory 22 in accordance with the procedures of the control memory 23. Image controller 24 further calculates the distances from the tip end of an imaged lead and any shift from a center of a width of the imaged lead.

The images stored in the image memory 22 are displayed on a television monitor 25.

The operation driver 30 includes: an X-axis motor controller 31, Y-axis motor controller 32 and Z-axis motor controller 33 which control an X-axis motor 12, Y-axis motor 13 and Z-axis motor 14, respectively; and a control memory 34 which stores control procedures for the X-axis motor controller 31, Y-axis motor controller 32 and Z-axis motor controller 33, as well as procedures for calculating bonding coordinates.

The operation driver 30 further includes an operation controller (CPU) 35 which controls the X-axis motor controller 31, Y-axis motor controller 32, Z-axis motor controller 33 and control memory 34. The operation controller 35 further calculates actual bonding coordinates based on center shift values calculated by the image controller 24 and bonding coordinate data inputted using the manual input device 45.

A bonding coordinate memory 36 which stores the bonding coordinates calculated by the operation controller 35, and a bonding coordinate memory 38 which is backed up with a battery so as to store the same data as the bonding coordinate memory 36 does are also included in the operation driver 30.

The offset value or amount W is stored in the bonding coordinate memories 36 and 38. Furthermore, the manual input device 45 is, for example, a ten-key 46 or a chessman 47; and coordinates are inputted into the driving controller 30 using either one of these devices.

The bonding coordinate teaching method will be described below.

Figure 5:
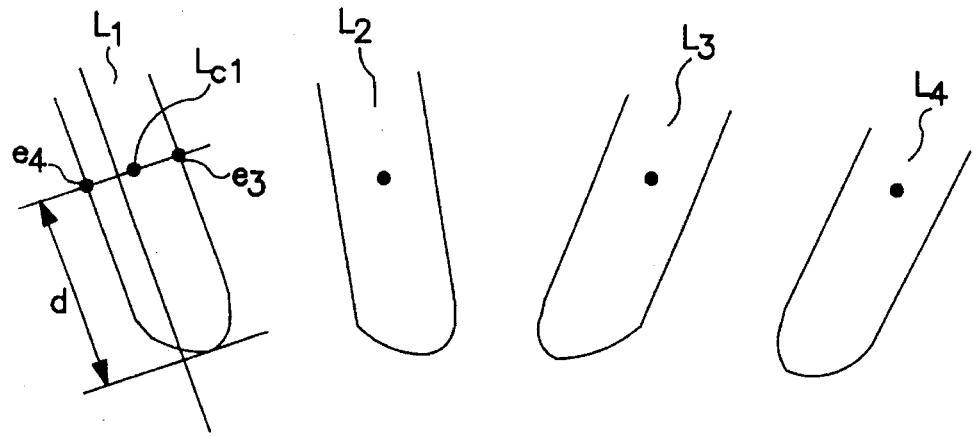
FIG. 5 is an enlarged top view of a portion of the leads shown in FIG. 6.
Figure 6:
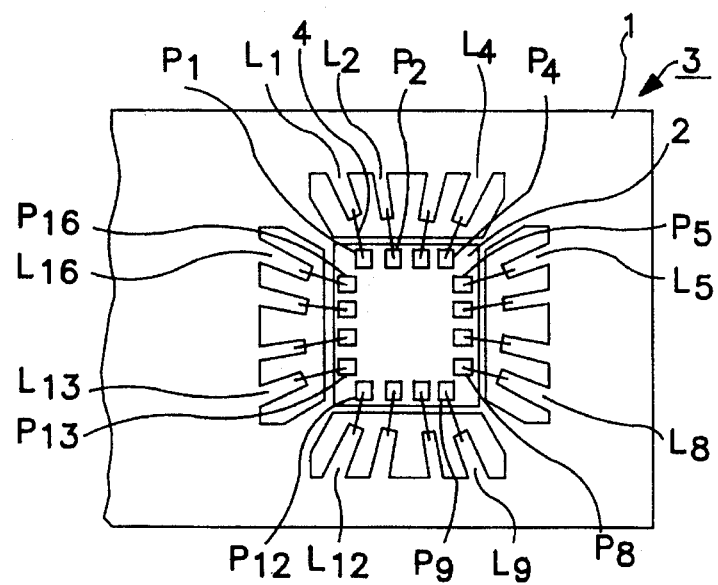
FIG. 6 is a top view showing one example of a workpiece.

In the embodiment, the bonding coordinates of leads $L_1$, $L_2$ ... are taught. This teaching is performed after the teaching of the bonding coordinates of pads $P_1$, $P_2$ ... has been completed. There are no particular restrictions on the teaching method used for the bonding coordinates of the pads $P_1$, $P_2$ .... In other words, the teaching may be performed by a conventional method. In addition, in this embodiment, as shown in FIGS. 5 and 6, leads $L_1$ through $L_4$ which are paired with pads $P_1$ through $P_4$ lined up continuously in the same direction leads, $L_5$ through $L_8$ which are paired with $P_5$ through $P_8$, leads $L_9$ through $L_{12}$ which are paired with $P_9$ through $P_{12}$, and leads $L_{13}$ through $L_{16}$ which are paired with $P_{13}$ through $P_{16}$, are treated together in respective groups.

Figure 2:
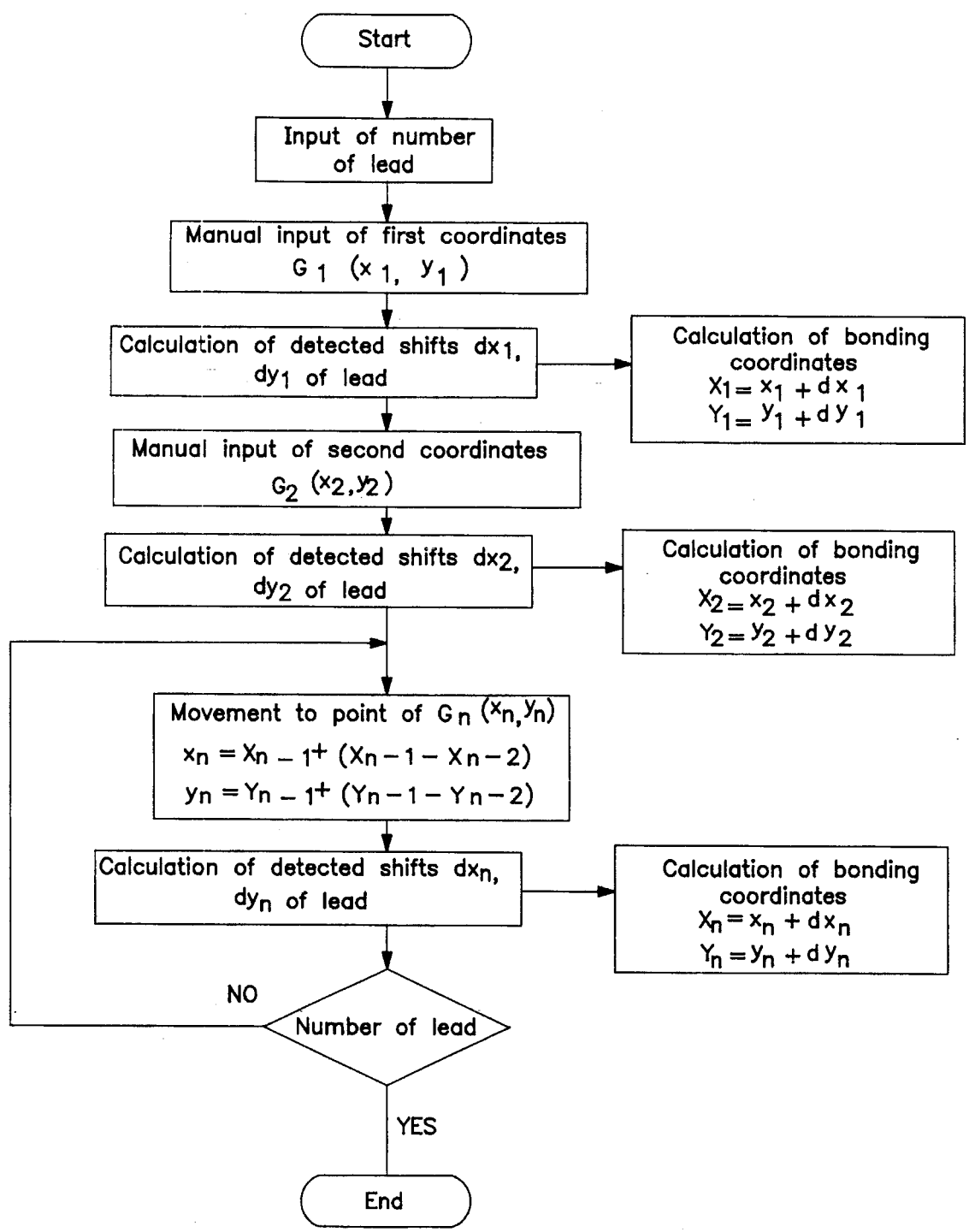
FIG. 2 is a flow chart of one embodiment of the teaching method of the present invention.

First, the teaching method used for leads $L_1$ through $L_4$ will be described with reference to FIG. 2.

Initially, the number of the leads $L_1$ through $L_4$, i.e., 4, is inputted.

Next, the XY table 16 is moved by the manual input device 45 so that the camera 11 is positioned in a position where the first lead $L_1$ is imaged, and the tentative coordinates $G_1$ ($x_1$, $y_1$) of this position are inputted into the operation controller 35. As a result, the tentative coordinates $G_1$ ($x_1$, $y_1$) are positioned at the center of the screen i.e., at the intersection of the cross-hairs on the television monitor 25. This image of the lead is converted into a digital signal by the image input means 21 and stored in the image memory 22. The image form stored in this image memory 22 is image-processed by the image controller 24, and the coordinates and amounts of shift of the lead $L_1$ are calculated.

Figure 3:
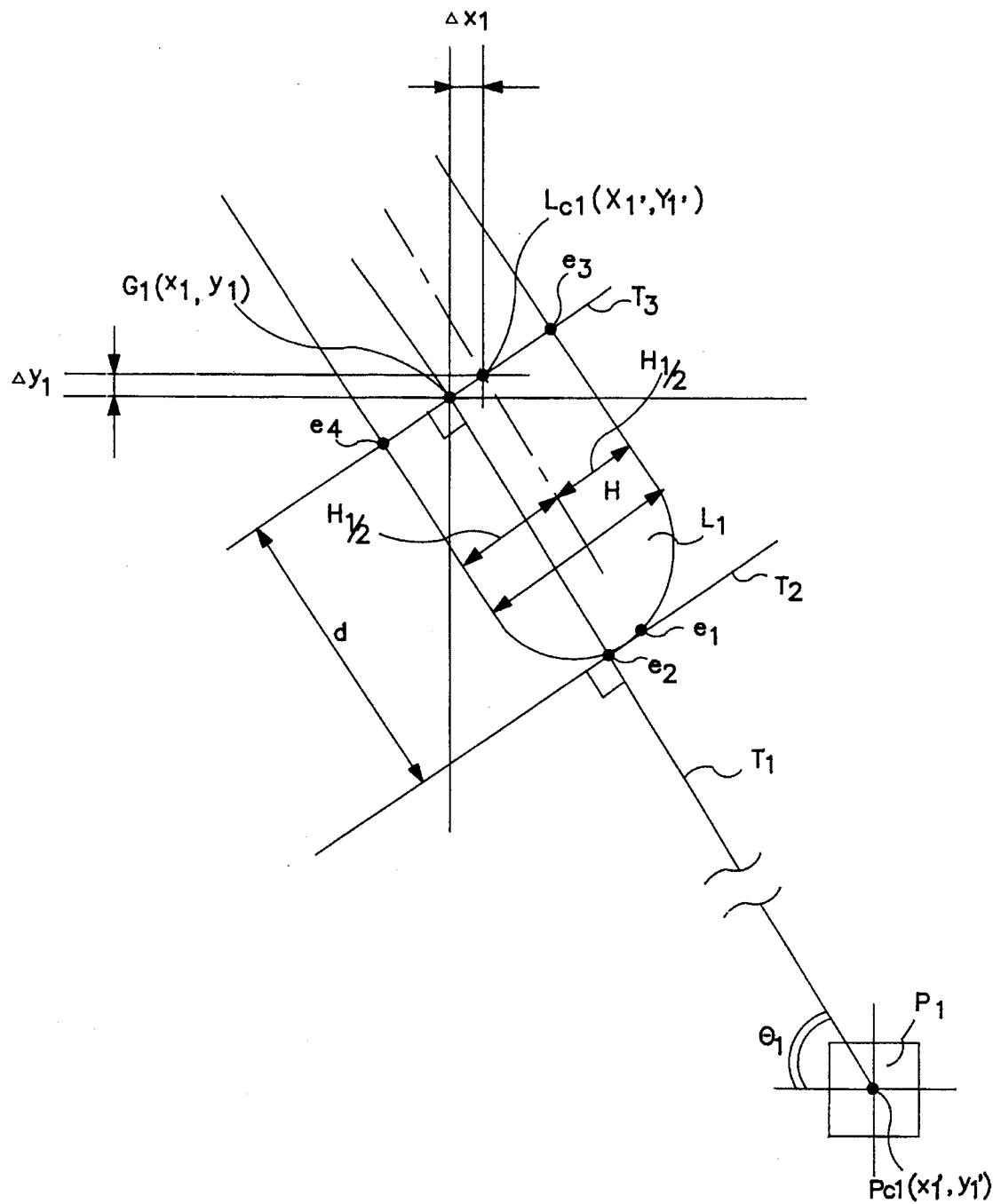
FIG. 3 is a diagram showing one example of a television monitor image.

FIG. 3 shows an example of the image of the lead $L_1$ displayed by the television monitor 25.

Since the coordinates $Pc_1$ ($x_1'$, $y_1'$) of the pad $P_1$ paired with the lead $L_1$ have already been confirmed, a straight line $T_1$ with an angle $O_1$ which connects the coordinates $Pc_1$ to the screen center $G_1$ (i.e., the cross-hairs on the television monitor 25) is determined.

Next, a straight line $T_2$ which is perpendicular to the straight line $T_1$ and which passes through the peripheral point $e_1$ of the lead $L_1$ which is closest to the pad $P_1$ (i.e., the so-called "tip" of the lead $L_1$), and the point $e_2$ where this straight line $T_2$ intersects the straight line $T_1$, are determined.

Then, a straight line $T_3$ which is parallel to the straight line $T_2$ and which passes through the screen center $G_1$ is determined.

More specifically, the distance d from the tip of the lead is determined by using the image controller 24 of the image processor 20 to calculate the distance between the manually input tentative bonding coordinates $G_1$ ($x_1$, $y_1$) of the first lead and the coordinates of the tip point ($e_2$) of the lead $L_1$ imaged by the camera 11. Here, the distance d is a distance indicating how far in from the tip of the lead L a bonding is to be performed. There are no particular restrictions on this distance d; generally, however, if the width of the leads L is 100 to 200 microns, the distance d is set at 150 to 300 μm.

Next, the peripheral points $e_3$ and $e_4$ of the lead $L_1$ on the straight line $T_3$ are determined, and the center point between the two peripheral points $e_3$ and $e_4$ ($H_1/2$, where $H_1$ is the width of the lead), i.e., the bonding coordinates $Lc_1$ ($X_1'$, $Y_1'$) on the screen, are also determined. In this case, the calculated positional coordinates can be detected with sub-pixel precision.

In regard to sub-pixel calculations, it is known that points having a maximum correlation value can be found with sub-pixel precision by using HILL-CLIMB and interpolation techniques, etc., in addition to a multi-value (graded image) correlation treatment.

The center point between the peripheral points $e_3$ and $e_4$ (i.e., the center of the lead width $H_1$) is calculated by the image controller 24 of the image processor 20. In this case, the image of the lead obtained by the camera 11 in the direction perpendicular to the straight line $T_1$ connecting the bonding coordinates $Pc_1$ ($x_1'$, $y_1'$) of the pad $P_1$ and the tentative bonding coordinates $G_1$ ($x_1$, $y_1$) of the lead $L_1$ (i.e., in the direction of the straight line $T_3$) is taken as the width $H_1$.

The image controller 24 calculates the bonding coordinates $Lc_1$ ($X_1'$, $Y_1'$) on the screen as described above, and then uses Equation 1 to calculate the respective amounts of shift $\Delta x_1$, $\Delta y_1$ of the bonding coordinates $Lc_1$ ($X_1'$, $Y_1'$) from the central axis 11a (image center of the camera 11, i.e., from the manually input coordinates $G_1$ ($x_1$, $y_1$).

$$\Delta x_1 = x_1 - X_1'$$
$$\Delta y_1 = y_1 - Y_1' \tag{1}$$

These shift amounts $\Delta x_1$ and $\Delta y_1$ are determined as numbers of pixels in the image memory 22. However, the actual dimensions per pixel depend on the magnification of the camera 11 and are therefore peculiar to the apparatus used. Accordingly, these values can be converted into amounts of movement of the XY table. If the constants used for this conversion are kx and ky, the actual dimensional shifts $dx_1$ and $dy_1$ can be calculated using Equation 2, and the bonding coordinates $Lc_1$ ($X_1$, $Y_1$) of the lead $L_1$ can be calculated using Equation 3. These values $dx_1$, $dy_1$ and bonding coordinates $Lc_1$ ($X_1$, $Y_1$) are calculated by the operation controller 35, and the resulting bonding coordinates of the lead $L_1$ are stored in the bonding coordinate memory 36.

$$dx_1 = kx \cdot \Delta x_1$$

$$dy_1 = ky \cdot \Delta y_1 \qquad (2)$$

$$X_1 = x_1 + dx_1$$

$$Y_1 = y_1 + dy_1 \qquad (3)$$

Figure 4:
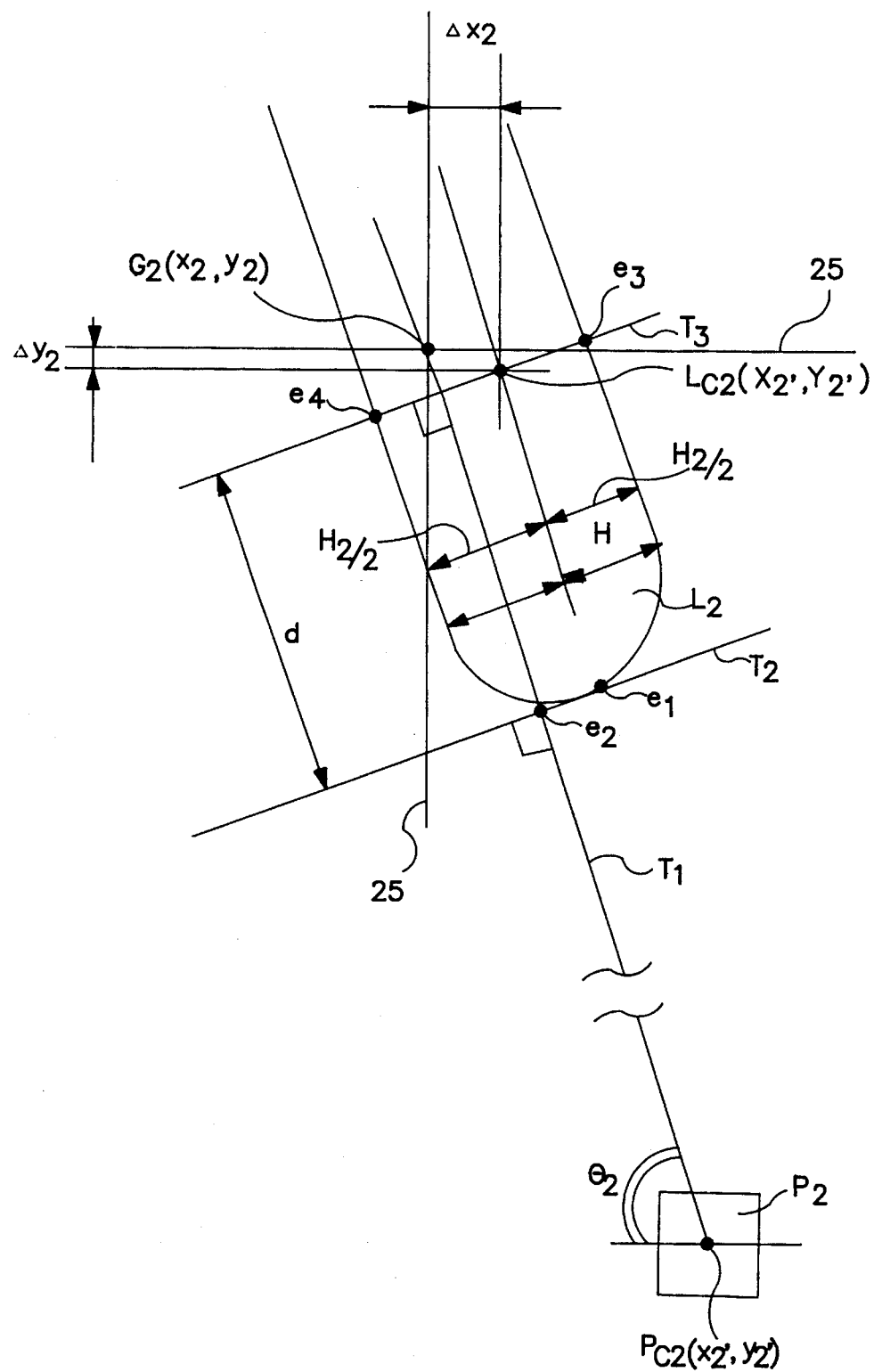
FIG. 4 is a diagram showing another example of a television monitor image.

Next, the XY table 16 is moved using the manual input device 45 so that the camera 11 is positioned directly above the second lead $L_2$, and the resulting coordinates $G_2$ ($x_2$, $y_2$) are inputted into the operation controller 35. FIG. 4 shows an example of the image of the lead $L_2$ displayed by the television monitor 25.

For the first lead $L_1$, the distance between the manually input tentative bonding coordinates $G_1$ ($x_1$, $y_1$) are positioned on the straight line $T_3$. However, in the case of the second leads $L_2$, and $L_3$ ... which follow the second lead, the coordinates $G_2$ ($x_2$, $y_2$) (i.e., the center of the cross-hairs on the television monitor 25) are as shown in FIG. 4.

Since the coordinates $Pc_2$ ($x_2'$, $y_2'$) of the pad $P_2$ paired with the lead $L_2$ have already been confirmed, a straight line $T_1$ having an angle of $O_2$ which connects the coordinates $Pc_2$ to the screen center $G_2$ (i.e., the cross-hairs on the television monitor 25) can be determined.

Next, a straight line $T_2$ which is perpendicular to the straight line $T_1$, and which passes through the peripheral point $e_1$ of the lead $L_1$ which is closest to the pad $P_2$ (i.e., the so-called "tip" of the lead $L_2$), and the point $e_2$ where this straight line $T_2$ intersects the straight line $T_1$, are determined.

Then, a straight line $T_3$ which is parallel to the straight line $T_2$, and which is moved from the tip of the lead by a distance of d, is determined.

Here, the distance d from the tip of the lead consists of the distance confirmed for the first lead $L_1$ used "as is".

Next, the peripheral points $e_3$ and $e_4$ of the lead $L_1$ on the straight line $T_3$ are determined, and the center point between the two peripheral points $e_3$ and $e_4$ ($H_2/2$, where $H_2$ is the width of the lead), i.e., the bonding coordinates $Lc_2$ ($X_2'$, $Y_2'$) on the screen, are determined.

The center point between the peripheral points $e_3$ and $e_4$ (i.e., the center $\{H_2/2\}$ of the lead width $H_2$) is calculated by the image controller 24 of the image processor 20. In this case, the image of the lead obtained by the camera 11 in the direction perpendicular to the straight line $T_1$ that connects the bonding coordinates $Pc_2$ ($x_2'$, $y_2'$) of the pad $P_2$ to the tentative bonding coordinates $G_2$ ($x_2$, $y_2$) of the lead $L_2$ (i.e., in the direction of the straight line $T_3$) is taken as the width $H_2$.

The image controller 24 calculates the bonding coordinates $Lc_2$ ($X_2'$, $Y_2'$) on the screen as described above, and then uses Equation 4 to calculate the respective amounts of shift $\Delta x_2$, $\Delta y_2$ of the bonding coordinates $Lc_2$ ($X_2'$, $Y_2'$) from the central axis 11a (image center) of the camera 11, i.e., from the manually input coordinates $G_2$ ($x_2$, $y_2$).

$$\Delta x_2 = x_2 - X_2'$$

$$\Delta y_2 = y_2 - Y_2' \qquad (4)$$

As in the case of the lead $L_1$, these shift amounts $\Delta x_2$, $\Delta y_2$ are subjected to image processing, so that the actual dimensional shifts $dx_2$ and $dy_2$ of the coordinates $G_2$ ($x_2$, $y_2$), and the bonding coordinates $Lc_2$ ($X_2$, $Y_2$), are determined. These bonding coordinates are then stored in the bonding coordinate memory 36.

Next, the bonding coordinates $Lc_3$ ($X_3$, $Y_3$) and $Lc_4$ ($X_4$, $Y_4$) of the leads $L_3$ and $L_4$ are calculated. The coordinates of these leads from $L_3$ on are calculated automatically without any input being made.

Generally, there is no great variation in the respective distances from lead $L_1$ to $L_2$, $L_2$ to $L_3$, and $L_3$ to $L_4$. In other words, it is sufficient that if the distance from $L_2$ to $L_3$ is within a range which allows the lead $L_3$ to be imaged by the camera 11 when the camera 11 is moved from the bonding coordinates $Lc_2$ ($X_2$, $Y_2$) by a distance corresponding to ($X_2-X_1$), ($Y_2-Y_1$). Furthermore, the direction which causes the camera 11 to move to $L_3$ is judged by the operation controller 35 to be the same as the direction from lead $L_1$ to lead $L_2$. Accordingly, tentative bonding coordinates $G_3$ ($x_3$, $y_3$) are calculated by the operation controller 35, using Equation 5, on the basis of the calculated bonding coordinates $Lc_1$ ($X_1$, $Y_1$) and $Lc_2$ ($X_2$, $Y_2$), and the X-axis motor 12 and Y-axis motor 13 are driven so that the central axis 11a of the camera 11 is moved to the coordinates $G_3$ ($x_3$, $y_3$).

$$x_3 = X_2 + (X_2 - X_1)$$

$$y_3 = Y_2 + (Y_2 - Y_1) \qquad (5)$$

The actual shifts $dx_3$, $dy_3$ and bonding coordinates $Lc_3$ ($X_3$, $Y_3P$) of the lead $L_3$ are determined by image processing as described above, and the bonding coordinates are stored in the bonding coordinate memory 36.

The next lead $L_4$ is treated in the same manner as the lead $L_3$; accordingly, a description of this treatment is omitted.

For the n-th lead, the tentative coordinates thereof $G_n$ ($X_n$, $y_n$) can be expressed by Equation 6. Furthermore, where $\Delta x_n$ and $\Delta y_n$ are the shift values of the n-th lead, the actual shifts $dx_n$ and $dy_n$ and the bonding coordinates $Lc_n$ ($X_n$, $Y_n$) of the n-th lead $L_n$ can be expressed by Equations 7 and 8, respectively.

$$xn = Xn_{-1} + (Xn_{-1} - Xn_{-2})$$

$$yn = Yn_{-1} + (Yn_{-1} - Yn_{-2}) \qquad (6)$$

$$dxn = kx \cdot \Delta xn$$

$$dyn = ky \cdot \Delta yn \qquad (7)$$

$$Xn = xn + dxn$$

$$Yn = yn + dyn \qquad (8)$$

In the above embodiment, the calculation of the bonding coordinates $Lc_3$ ($X_3$, $Y_3$) of the lead $L_3$ of the lead $L_3$ is accomplished by calculating the difference between the bonding coordinates $Lc_1$ ($X_1$, $Y_1$) and $Lc_2$ ($X_2$, $Y_2$) and by moving the camera 11 by an amount corresponding to the difference so that the tentative bonding coordinates $G_3$ ($x_3$, $y_3$) of the lead $L_3$ are positioned in the center of the screen. However, in cases where the lead $L_3$ appears on the screen together with the lead $L_2$, it would also be possible to calculate the bonding coordinates $Lc_3$ ($X_3$, $Y_3$) of the lead $L_3$ by performing image processing using tentative bonding coordinates $G_3$ ($x_3$, $y_3$) obtained by Equation 4 without actually moving the camera 11.

The teaching method used for leads $L_5$ through $L_8$ will be described below.

In this case, as in the case of the teaching method used for the leads $L_1$ through $L_4$, tentative coordinates $G_5$ ($x_5$, $y_5$) and $G_6$ ($x_6$, $y_6$) for leads $L_5$ and $L_6$ and the number of leads $L_5$ through $L_8$ are inputted, and processing is performed in the same manner as in the case of the leads $L_1$ through $L_4$. The same is true for the leads $L_9$ through $L_{12}$ and leads $L_{13}$ through $L_{16}$; accordingly, a description of these leads is omitted here.

As seen from the above, by imaging the first and second leads of each group of leads lined up in a continuous row by a camera and inputting the coordinates of the first and second leads, the coordinates of all of the leads are automatically calculated by the image processor 20, and the bonding coordinates are calculated by the operation driver 30. In other words, it is necessary to input only a small number of coordinates, and there is no need to align the center of each lead with the cross-hairs on the screen. Accordingly, the operating time required is greatly reduced, and positioning errors due to mistakes made by the operator or differences between individual operators, etc. are eliminated, so that the positional precision of the bonding coordinates is improved.

Furthermore, generally the resolution of the television monitor is 6 microns/pixel; as a result, positions finer than this cannot be judged in the case of manual positioning. In the present invention, however, sub-pixel calculations are possible, so that there is a detection precision of 1/32 pixel. Even if disturbing factors are included, a precision of 1/4 pixel, i.e., 1.5 microns, can be obtained.

According to the present invention, by inputting coordinates of the first and second leads, the coordinates of all of the remaining leads are automatically calculated by an image processor, and the bonding coordinates are calculated by an operation driver. Accordingly, the operating time is reduced and the positioning precision is improved.

I claim:

1. A bonding coordinate teaching method used in a wire bonding apparatus that includes a capillary for connecting pads and leads via wires for a workpiece that consists of a semiconductor chip installed on a lead frame, a camera for obtaining an image of said workpiece, and an XY table for moving said capillary and camera together horizontally, wherein said teaching method comprises the steps of:

(1) for first and second leads:
      (i) manually inputting tentative bonding coordinates using a manual input device,
      (ii) moving said camera so as to take images of said first and second leads,
      (iii) calculating a distance from a tip of and a center of width of each of said first and second leads via an image controller of an image processor,
      (iv) correcting said manually inputted tentative bonding coordinates of said first and second leads via an operation controller of an operation driver, and
      (v) storing said corrected coordinates as new bonding coordinates in a bonding coordinate memory, and (2) for each of third and following leads:
      (i) calculating a difference between two sets of new bonding coordinates of leads that are immediately preceding a currently detected lead and a lead preceding to such an immediately preceding lead by said operation controller of said operation driver,
      (ii) either (a) moving said camera by an amount that corresponds to thus obtained difference from bonding coordinates of a lead immediately preceding said currently detected lead or (b) adding thus obtained difference to bonding coordinates of a lead immediately preceding said currently detected lead so as to produce tentative bonding coordinates of said currently detected lead,
      (iii) calculating via said image controller of said image processor a distance from a tip end of and a center of width of said currently detected lead whose image is taken by said camera,
      (iv) correcting coordinates to which said camera has been moved or correcting said tentative bonding coordinates, via said operation controller of said operation driver, and
      (v) storing said corrected coordinates as new bonding coordinates in said bonding coordinate memory.

2. A bonding coordinate teaching method according to claim 1 wherein said distance from said tip of said lead is obtained via said image controller of said image processor by calculating a distance between said manually inputted tentative bonding coordinates of said first lead and coordinates of tip of said lead imaged by said camera.

3. A bonding coordinate teaching method according to claim 1 wherein said center of width of said lead is obtained via said image controller of said image processor by calculating an image of said lead as said width, said lead being imaged by said camera in a direction perpendicular to a straight line connecting bonding coordinates of a pad confirmed by teaching beforehand and said lead.

4. A bonding coordinate teaching means for a bonding apparatus comprising a capillary for connecting pads and leads via wires for a workpiece that consists of a semiconductor chip installed on a lead frame, a camera for obtaining an image of said workpiece, an XY table for moving said capillary and camera together horizontally, and a manual input device for inputting bonding coordinates, said means further comprising:

(A) an image controller installed in an image processor, said image controller processing images obtained by said camera and calculates distance from a tip of and a center width of an imaged lead which is obtained by said camera, (B) an operation controller installed in an operation driver, said operation controller being designed so that
      (1) for first and second leads,
         (i) tentative bonding coordinates are manually inputted,
         (ii) said camera is moved so as to take images of said leads,
         (iii) a distance from a tip of and a center of width of each of said first and second leads imaged by said camera are calculated by said image controller of said image processor, and
         (iv) tentative bonding coordinates of said first and second leads are corrected so as to produce new bonding coordinates, and
      (2) for each of third and following leads,
         (i) a difference between respective new bonding coordinates of a lead immediately preceding a currently detected lead and a lead preceding such immediately preceding lead is calculated,
         (ii) either (a) said camera is moved by an amount that corresponds to thus obtained difference from bonding coordinates of a lead immediately preceding said currently detected lead, or (b) thus obtained difference is added to bonding coordinates of a lead immediately preceding said currently detected lead so as to produce tentative bonding coordinates of said currently detected lead,
         (iii) a distance from a tip of and a center of width of said currently detected lead whose image is taken by said camera is calculated via said image controller of said image processor, and
         (iv) coordinates to which said camera has been moved or said tentative bonding coordinates are corrected so as to produce new bonding coordinates of said currently detected lead, and (C) a bonding coordinate memory which stores said new bonding coordinates.

* * * * *